US009230874B1

(12) United States Patent
Li

(10) Patent No.: US 9,230,874 B1
(45) Date of Patent: Jan. 5, 2016

(54) INTEGRATED CIRCUIT PACKAGE WITH A HEAT CONDUCTOR

(75) Inventor: Yuan Li, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/501,974

(22) Filed: Jul. 13, 2009

(51) Int. Cl.
*H01L 23/373* (2006.01)
*H01L 23/34* (2006.01)
*H01L 23/367* (2006.01)

(52) U.S. Cl.
CPC ............ *H01L 23/34* (2013.01); *H01L 23/3675* (2013.01); *H01L 23/367* (2013.01); *H01L 23/373* (2013.01); *H01L 23/3738* (2013.01)

(58) Field of Classification Search
CPC .. H01L 21/67366; H01L 21/656; H01L 23/10
USPC ................................. 257/707, 713, 717, 720
See application file for complete search history.

(56) References Cited

U.S. PATENT DOCUMENTS 5,705,851 A * 1/1998 Mostafazadeh et al. ...... 257/675
5,883,430 A * 3/1999 Johnson ........................ 257/706
6,534,859 B1 * 3/2003 Shim et al. .................... 257/706
6,720,649 B2 * 4/2004 Huang .......................... 257/706
8,211,753 B2 * 7/2012 Ramakrishna et al. ....... 438/122
2001/0015492 A1 * 8/2001 Akram et al. ................. 257/706
2002/0166687 A1 * 11/2002 Tornovist et al. ............ 174/52.2
2003/0057550 A1 * 3/2003 Zhao et al. .................... 257/734
2003/0107124 A1 * 6/2003 Huang .......................... 257/706
2005/0046012 A1 * 3/2005 Ramakrishna et al. ....... 257/706
2006/0019429 A1 * 1/2006 Lee et al. ...................... 438/122
2007/0278664 A1 * 12/2007 Carney et al. ................ 257/706
2008/0157347 A1 * 7/2008 Takashima .................... 257/712
2009/0096115 A1 * 4/2009 Huang et al. .................. 257/796
2009/0127690 A1 * 5/2009 Jaducana et al. ............. 257/690
2010/0001410 A1 * 1/2010 Kang ........................... 257/778

* cited by examiner

*Primary Examiner* — William Harriston
(74) *Attorney, Agent, or Firm* — Womble Carlyle Sandridge & Rice LLP

(57) ABSTRACT

An integrated circuit (IC) package with a heat conductor is disclosed. The IC package has an IC disposed on a surface of a package substrate. A molding compound injected into the IC package surrounds the IC package and covers the perimeter of the top surface of the IC, exposing the center portion of the top surface of the IC. A heat conductor is disposed onto the top surface of the IC that is not covered by the molding compound. The heat conductor is placed such that the heat conductor lies adjacent to the center portion of the top surface of the IC and the edges of the heat conductor are surrounded by the molding compound.

19 Claims, 3 Drawing Sheets

350
355
360
102
360
108
115

INTEGRATED CIRCUIT PACKAGE WITH A HEAT CONDUCTOR

BACKGROUND

Integrated circuit (IC) chips are usually mounted on IC packages. Different types of IC packages cater to different types of applications and requirements. With the increase in processing power, heat dissipation has become one of the core issues in IC packaging. The heat generated by the IC chip in a package affects the overall performance and reliability of the device. Heat dissipation is thus an important aspect in IC packaging because unwanted heat in a circuit needs to be dissipated to prevent an excessive rise in temperature that could possibly affect the performance of the circuit.

The thermal resistance of an IC package is one measure of the ability of the IC package to transfer heat generated by the IC chip out of the IC package. An IC package with a high thermal resistance has a low thermal performance because of its inefficiency in transferring heat generated by its IC chip. Therefore, packages that have a high thermal resistance are unsuitable for high power applications, e.g., circuitry that are operating above 3 watts.

The thermal resistance in an IC package depends very much on the materials used in that IC package. For example, in a conventional wire-bond ball grid array (BGA), the molding compound used may have a low thermal conductivity and would thus be a poor heat conductor. As such, a conventional wire-bond BGA package may only be suitable for low power applications. An embedded heat slug may be used to improve the thermal conductivity of an IC package. However, the use of a heat slug limits the size of the die as it takes up a substantial substrate area.

Therefore, it is desirable to reduce the thermal resistance of an IC package to improve its thermal performance. It is also desirable to have a cost-effective method to reduce the thermal resistance without limiting the size of the die that can be mounted on the IC package. It is within this context that the invention arises.

SUMMARY

Embodiments of the present invention include apparatuses and a method for creating an IC package with a heat conductor.

It should be appreciated that the present invention can be implemented in numerous ways, such as a process, an apparatus, a system, or a device. Several inventive embodiments of the present invention are described below.

In one embodiment, an IC package is disclosed. The IC package includes an IC disposed on a package substrate. A molding compound is injected onto the surface of the package substrate. The injected molding compound surrounds the IC and covers a perimeter area of the top surface of the IC. A heat conductor is disposed on the top surface of the IC such that the heat conductor is surrounded by the molding compound. In one embodiment, the heat conductor is shaped such that the heat conductor substantially fills the hole created by the molding compound.

In another embodiment in accordance with the present invention, a method of packaging an IC is disclosed. The method includes placing an IC onto a packaging substrate. Molding compound is injected into the IC package so that the molding compound surrounds the IC and covers a portion of the top surface of the packaging substrate. The molding compound also covers a perimeter area of the top surface of the IC. A heat conductor is disposed on the top surface of the IC. The heat conductor is in direct contact with the center area of the top surface of the IC and is surrounded by the molding compound.

In yet another embodiment, an IC package is disclosed. The IC package comprises a package substrate with an IC disposed on the surface of the package substrate. A molding compound surrounds the IC and covers a perimeter area of the top surface of the IC, forming a cavity on the top surface of the IC. A heat conductor is placed in the cavity. The heat conductor fills the cavity formed by the molding compound. In one embodiment, the heat conductor is in direct contact with the center area of the top surface of the IC.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe apparatuses and a method for creating an IC package with a heat conductor.

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create an IC package with a heat conductor to improve heat dissipation and thermal performance. One embodiment describes an IC package with a high thermal conductivity material used as a heat conductor. Another embodiment describes the process to create an IC package with a heat conductor. These embodiments reduce thermal resistance without limiting the size of the IC chip. Embedding a heat conductor with a high thermal conductivity in the IC package instead of using a conventional heat slug frees up space on the package substrate. Having a heat conductor also allows the device to potentially support medium to high power applications.

Figure 1:
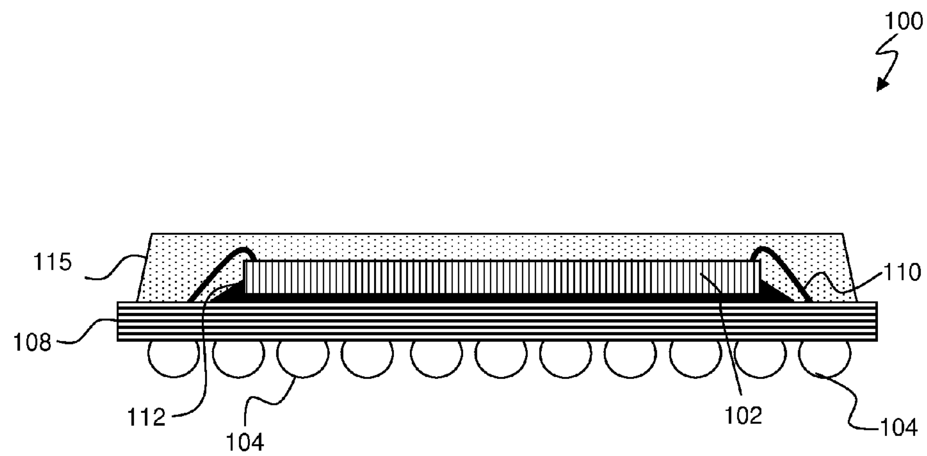
FIG. 1, meant to be exemplary and not limiting, shows an integrated circuit (IC) package.

FIG. 1, meant to be exemplary and not limiting, shows IC package 100. IC 102 is disposed on one side of package substrate 108. IC 102 is attached to package substrate 108 with adhesive 112. Adhesive 112 may be conductive adhesive or solder in the form of paste. Wires 110 are attached to the top side of IC 102 and package substrate 108. Commonly used wires are either made of gold (Au), aluminum (Al) or copper (Cu). Wires 110 electrically connect IC 102 to package substrate 108. Molding compound 115 encapsulates IC package 100 to protect IC package 100 and all the other components from moisture and external elements. It should be appreciated that the thermal conductivity of molding compound 115 is relatively low and is generally less than 1 W/mK (watt per meter per kelvin). Therefore, molding compound 115 is not a particularly good heat conductor and IC package 100 may not be able to support high power applications that are typically 3 W or more. In one embodiment, molding compound 115 is made of epoxy resin. A plurality of contact leads or solder balls 104 is disposed on an opposing side of package substrate 108. Signals from IC 102 are transmitted outside of IC package 100 by solder balls 104.

Figure 2:
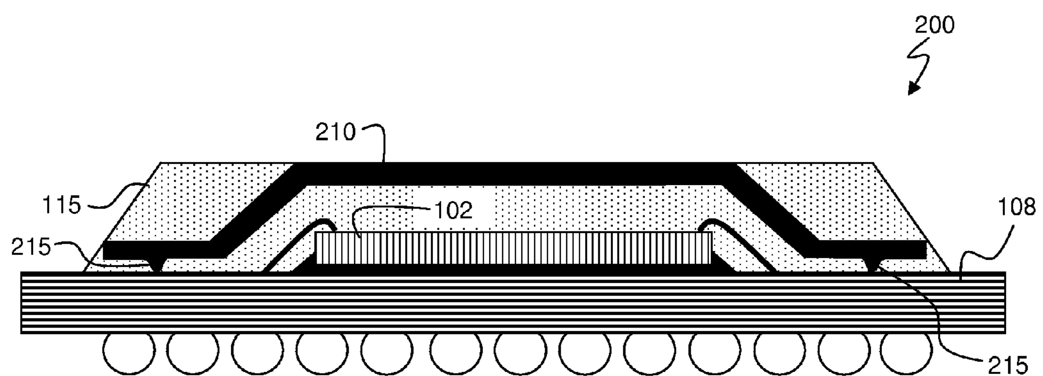
FIG. 2, meant to be illustrative and not limiting, shows another IC package with an embedded heat slug.

FIG. 2, meant to be illustrative and not limiting, shows IC package 200 with heat slug 210. IC package 200 shares many similarities with IC package 100 of FIG. 1. For the sake of brevity, components already shown in IC package 100 of FIG. 1 and described above are not repeated. To improve the overall thermal conductivity of IC package 200, heat slug 210 is placed in IC package 200. In one embodiment heat slug 210 is a metal plate encapsulated by molding compound 115. Heat slug 210 has a relatively higher thermal conductivity compared to molding compound 115. The exposed surface of heat slug 210 acts to dissipate heat generated by IC 102 in IC package 200. Heat slug 210 is attached to package substrate 108 through dimples 215 on the heat slug. Heat slug 210 increases the ability of IC package 200 to dissipate heat, while dimples 215 improve the adhesion between heat slug 210 and package substrate 108. However, dimples 215 on heat slug 210 may limit the size of IC 102 in the IC package. Because heat slug 210 is shaped as such, the size of IC 102 cannot exceed the area surrounded by dimples 215 of heat slug 210. If a bigger IC needs to be used, then substrate 108 needs to be enlarged to accommodate the bigger IC and subsequently, a bigger heat slug 210.

Figure 3A:
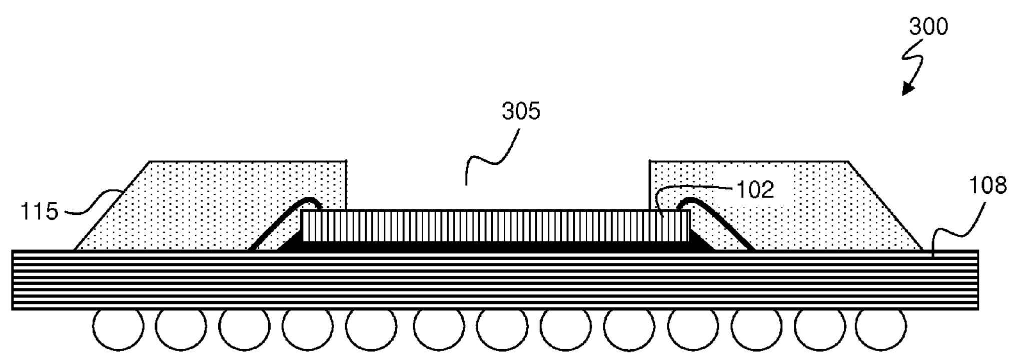
FIG. 3A, meant to be illustrative and not limiting, shows an IC package as an embodiment in accordance with the present invention.

FIG. 3A, meant to be illustrative and not limiting, shows an IC package 300 as an embodiment in accordance with the present invention. IC 102 in IC package 300 is surrounded by molding compound 115. However, unlike IC packages 100 and 200 of FIGS. 1 and 2, respectively, molding compound 115 in IC package 300 does not completely cover the top surface of IC 102. Molding compound 115 covers a perimeter area of the top surface of IC 102. In an exemplary embodiment, the perimeter area on the top surface of IC 102 covered by molding compound 115 is about 200 μm wide. When molding compound 115 is injected onto package substrate 108 of IC package 300, a portion of the top surface of IC 102 is left open, forming cavity 305. Cavity 305 formed by molding compound 115 leaves a portion of the top surface of IC 102 exposed. In one embodiment, cavity 305 can be filled with a heat conductor that is placed on top of IC 102, as shown in FIG. 3B and described below.

Figure 3B:
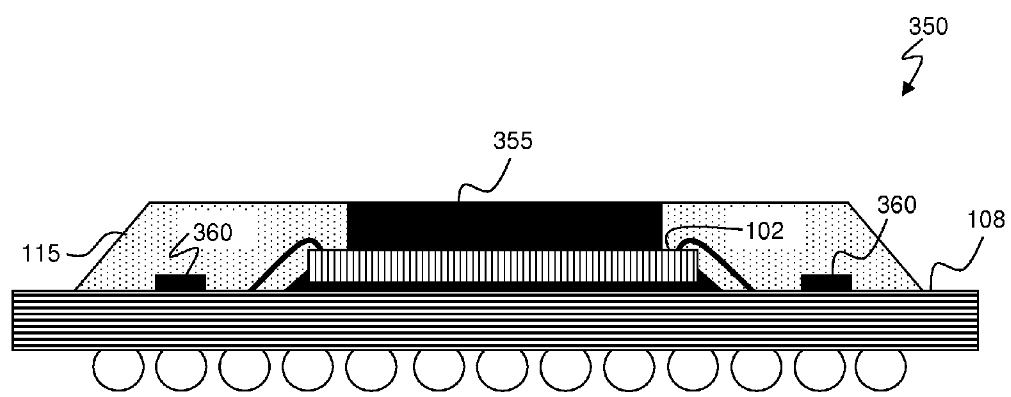
FIG. 3B, meant to be illustrative and not limiting, shows an IC package with a heat conductor as another embodiment in accordance with the present invention.

FIG. 3B, meant to be illustrative and not limiting, shows IC package 350 with heat conductor 355 as one embodiment in accordance with the present invention. A plurality of capacitors 360, generally used to reduce noise generated by IC 102, can be placed on build-up substrate 108, around IC 102. As described earlier, a cavity can be formed during the injection of molding compound 115 to leave an area on the top surface of IC 102 exposed. The area can be filled with a heat conductor, e.g., heat conductor 355, to improve heat dissipation in the IC package. Heat conductor 355 can be as thick as the height of molding compound 115 measured from the top surface of IC 102. In one embodiment, the height or thickness of molding compound 115 is substantially equal to the thickness of IC 102 and heat conductor 355 combined. As an illustrative example, molding compound 115 in IC package 350, measured from the surface of package substrate 108, is about 1 mm thick. The cavity, formed by molding compound 115 and filled by heat conductor 355, can be about 0.75 mm deep. Therefore, in this illustrative example, heat conductor 355 is about 0.75 mm and is substantially level with the top surface of molding compound 115. Heat conductor 355, disposed on IC 102, is surrounded by molding compound 115. In one embodiment, heat conductor 355 is made of alloy, e.g., copper alloy. In another embodiment, heat conductor 355 is made of silicon (Si). However, it should be appreciated that any metal (e.g. copper), or highly conductive material can be used as heat conductor 355. In an exemplary embodiment, heat conductor 355 is a high-K mold compound with a thermal conductivity above 2 W/mK.

Figure 4:
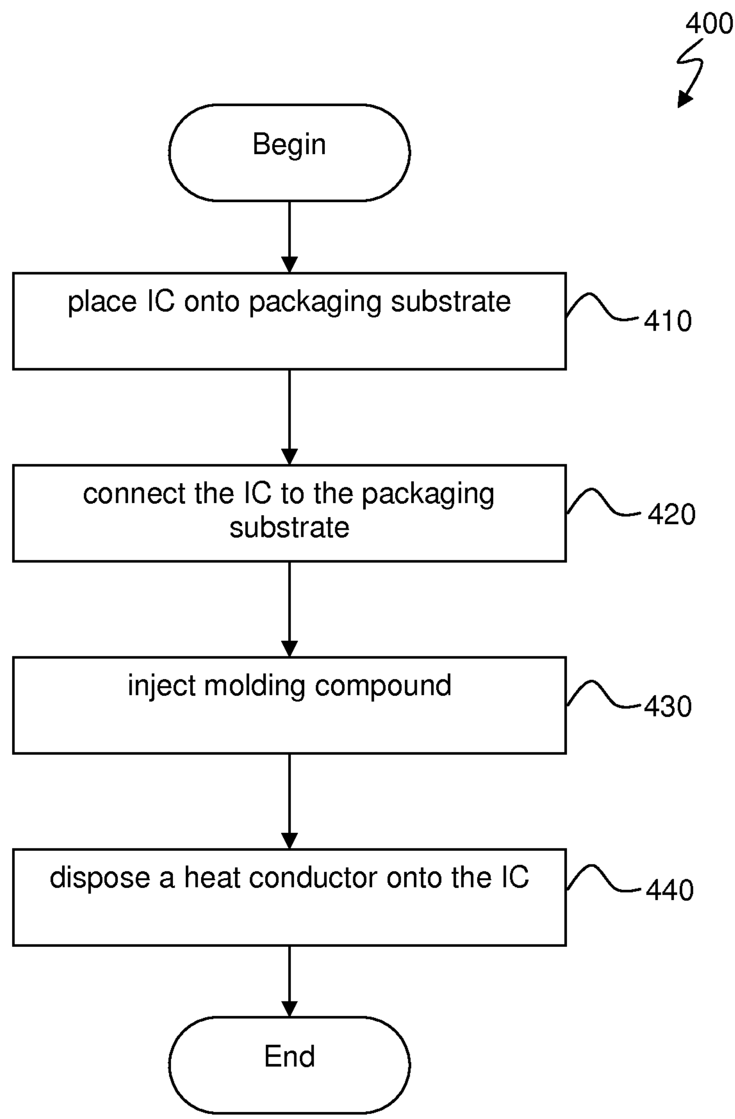
FIG. 4, meant to be illustrative and not limiting, shows a simplified method flow for packaging an IC in accordance with one embodiment of the present invention.

FIG. 4, meant to be illustrative and not limiting, shows method flow 400 for packaging an IC in accordance with one embodiment of the present invention. An IC is placed onto a packaging substrate in operation 410. The packaging substrate used may include a stack of laminates, commonly known as laminate substrates. It should be appreciated that the packaging substrate may be a glass fiber or an epoxy composite based substrate. Even though a packaging substrate is used in this context and is shown in illustrative embodiments of FIGS. 1-3B, one skilled in the art should appreciate that a lead frame may be used in place of the packaging substrate and the IC may be attached to the lead frame instead of a packaging substrate. The attached IC is connected to the packaging substrate in operation 420. In one embodiment, metal wires are used to electrically couple the IC to the packaging substrate. A molding compound is injected into the IC package in operation 430. The molding compound surrounds the IC and covers a perimeter of the top surface of the IC. In the illustrative embodiment of FIG. 3A, the molding compound forms cavity 355 on top of IC 102. A heat conductor is disposed onto the IC in operation 440. In one embodiment, the heat conductor is an embedded heat conductor that is surrounded by the molding compound. As shown in the illustrative embodiment of FIG. 3B, heat conductor 355 fills the cavity formed by molding compound 115. In one embodiment, the heat conductor is in direct contact with a portion of the top surface of the IC. In another embodiment, the heat conductor may be placed on a layer of TIM that is placed on top of the IC. One skilled in the art will appreciate that other well-known steps, such as substrate preparation, IC attachment, underfilling, wire bonding, molding and curing, etc., in the IC packaging process have been left out so as not to obscure the present invention.

Depositing a heat conductor with a relatively high thermal conductivity on top of ICs improves the thermal performances of the IC package. Typical molding compound may not be an effective heat conductor and as such, devices without a built-in heat conductor may not be able to support medium to high power applications that generate a substantial amount of heat. Having a built-in heat conductor improves heat dissipation in the IC and unlike an embedded heat slug, the heat conductor does not take up substantial surface area on the package substrate. Therefore, the described embodiments provide a cost-effective solution to reduce the thermal resistance in an IC package.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) package, comprising:

a package substrate;

an IC disposed on a surface of the package substrate;

a first molding compound molded on the surface of the package substrate, wherein the first molding compound surrounds a periphery of the IC and is disposed along a perimeter of a top surface of the IC, inner edges of the first molding compound define a cavity over the top surface of the IC, wherein the first molding compound is contiguous from the perimeter to a peripheral region of the package substrate; and a heat conductor disposed within the cavity on the top surface of the IC, wherein outer edges of the heat conductor are surrounded by the inner edges of the first molding compound, and wherein the heat conductor comprises a second molding compound molded onto the IC, the second molding compound having a first exposed surface and having a second surface in direct contact with the IC, and wherein the IC package is a molded type of IC package.

2. The IC package of claim 1, wherein the package substrate is a lead frame substrate.

3. The IC package of claim 1, wherein the package substrate comprises a plurality of laminates.

4. The IC package of claim 1, wherein the heat conductor comprises silicon.

5. The IC package of claim 1, wherein the heat conductor has a thermal conductivity of at least 2 watts per meter per Kelvin (W/mK).

6. The IC package of claim 1, wherein the IC package is a wirebond package.

7. The IC package of claim 1, wherein a top surface of the heat conductor is substantially level with a top surface of the molding compound, wherein the heat conductor has a thermal conductivity greater than 2 (W/mK).

8. A method of packaging an integrated circuit (IC), comprising:

placing an IC onto a top surface of a packaging substrate;

injection molding a first molding compound, wherein the first molding compound covers at least a portion of the top surface of the packaging substrate and surrounds the IC, and wherein the first molding compound covers a perimeter of a top surface of the IC;

the injection molding comprising:

defining a cavity over the top surface of the IC, wherein the first molding compound is contiguous from the perimeter to a peripheral region of the package substrate; and disposing a heat conductor within the cavity on the top surface of the IC, wherein the heat conductor comprises an injection molded high-K molding compound having a first surface that is exposed and having a second surface that is in thermal contact with a center portion of the top surface of the IC and wherein external edges of the heat conductor are surrounded by an inner edge of the first molding compound defining the cavity.

9. The method of claim 8, further comprising:

coupling the IC to the package substrate with a plurality of wires, wherein the coupling is performed before the injecting the first molding compound.

10. The method of claim 8, wherein the disposing the heat conductor comprises injecting a second molding compound having a thermal conductivity greater than 2 watts per meter per kelvin.

11. The method of claim 10, wherein the heat conductor is disposed in the cavity.

12. The method of claim 8, wherein the disposing the heat conductor includes disposing a thermal interface material (TIM).

13. An integrated circuit (IC) package, comprising:

a package substrate;

an IC disposed on the package substrate;

a first molding compound molded and surrounding the IC and covering a perimeter area of a top surface of the IC, wherein the molding compound forms a cavity on a top surface of the IC wherein the molding compound is contiguous from the perimeter area to a peripheral region of the package substrate; and a silicon heat conductor filling the cavity formed by the first molding compound, wherein a distance that the heat conductor extends above the top surface of the IC is substantially equal to a distance the first molding compound extends above the top surface of the IC, wherein the heat conductor comprises a second molding compound, which is molded with an exposed first surface and a second surface, the second surface in intimate contact with the top surface of the IC, and wherein the IC package is a molded package.

14. The IC package of claim 13, wherein the heat conductor comprises a thermal interface material (TIM).

15. The IC package of claim 13, wherein the heat conductor has a thermal conductivity greater than 2 watts per meter per Kelvin (W/mK).

16. The IC package of claim 13, wherein the heat conductor is in direct contact with the top surface of the IC.

17. The IC package of claim 13, wherein the IC is a programmable logic device.

18. The IC package of claim 13, further comprising:

a plurality of wires connecting the IC to the package substrate.

19. The IC package of claim 13, further comprising a plurality of capacitors disposed on a top surface along the peripheral region of the package substrate, the plurality of capacitors encapsulated by the molding compound surrounding the IC.

* * * * *